United States Patent [19]
Carson et al.

[11] Patent Number: 5,177,352
[45] Date of Patent: Jan. 5, 1993

[54] INTEGRATED OPTICAL TAMPER SENSOR WITH PLANAR WAVEGUIDE

[75] Inventors: Richard F. Carson; Stephen A. Casalnuovo, both of Albuquerque, N. Mex.

[73] Assignee: The United States of America as represented by the United States Department of Energy, Washington, D.C.

[21] Appl. No.: 711,235

[22] Filed: Jun. 6, 1991

[51] Int. Cl.[5] .................................. G01V 9/04
[52] U.S. Cl. ............................ 250/221; 250/227.14
[58] Field of Search ............... 250/227.14, 222.1, 551, 250/22; 340/541, 555; 385/2, 49

[56] References Cited

U.S. PATENT DOCUMENTS

| | | | |
|---|---|---|---|
| 4,360,921 | 11/1982 | Scifres et al. | 385/49 |
| 4,454,418 | 6/1984 | Walker | 250/227.14 |
| 4,560,868 | 12/1985 | Brogardh et al. | 250/227 |
| 4,675,518 | 6/1987 | Omura et al. | 385/49 |
| 4,750,799 | 6/1988 | Kawachi et al. | 385/49 |
| 4,785,180 | 11/1988 | Dietrich et al. | 250/231 R |
| 4,840,281 | 6/1989 | Phillips et al. | 215/230 |
| 4,857,893 | 8/1989 | Carroll | 340/572 |
| 4,967,071 | 10/1990 | Park et al. | 250/227.21 |
| 5,003,292 | 3/1991 | Harding et al. | 250/227.14 |

OTHER PUBLICATIONS

R. Hunsperger, "Integrated Optical Detectors", *Integrated Optics: Theory and Technology*, vol. 33, 1982, pp. 246-277.

E. Garmire, "Semiconductor Components For Monolithic Applications", *Integrated Optics*, vol. 7, 1979, pp. 243-293.

K. Furuya et al., "A Novel Deposit/Spin Waveguide Interconnection (DSWI) For Semiconductor Integrated Optics", *IEEE Journal Of Quantum Electronics*, vol. QE-18, No. 10, Oct. 1982, pp. 1783-1789.

Y. Yamamoto et al., "Characteristics of Optical Guided Modes In Multilayer Metal-Clad Planar Optical Guide With Low-Index Dielectric Buffer Layer", *IEEE Journal of Quantum Electronics*, vol. QE-11, No. 9, Sep. 1975, pp. 729-736.

H. George et al., "Sensor Applications of Low Finesse Integrated Optical Fabry-Perot Resonators", *Integrated Optics*, vol. 48, 1985, pp. 21-25.

S. Honkanen et al., "Vibration Sensor Using Integrated Optical Coupling Element", *Integrated Optics*, vol. 48, 1985, pp. 5-8.

*Primary Examiner*—David C. Nelms
*Assistant Examiner*—Khaled Shami
*Attorney, Agent, or Firm*—Karla Ojanen; James H. Chafin; William R. Moser

[57] ABSTRACT

A monolithic optical tamper sensor, comprising an optical emitter and detector, connected by an optical waveguide and placed into the critical entry plane of an enclosed sensitive region, the tamper sensor having a myriad of scraps of a material optically absorbent at the wavelength of interest, such that when the absorbent material is in place on the waveguide, an unique optical signature can be recorded, but when entry is attempted into the enclosed sensitive region, the scraps of absorbent material will be displaced and the optical/electrical signature of the tamper sensor will change and that change can be recorded.

12 Claims, 4 Drawing Sheets

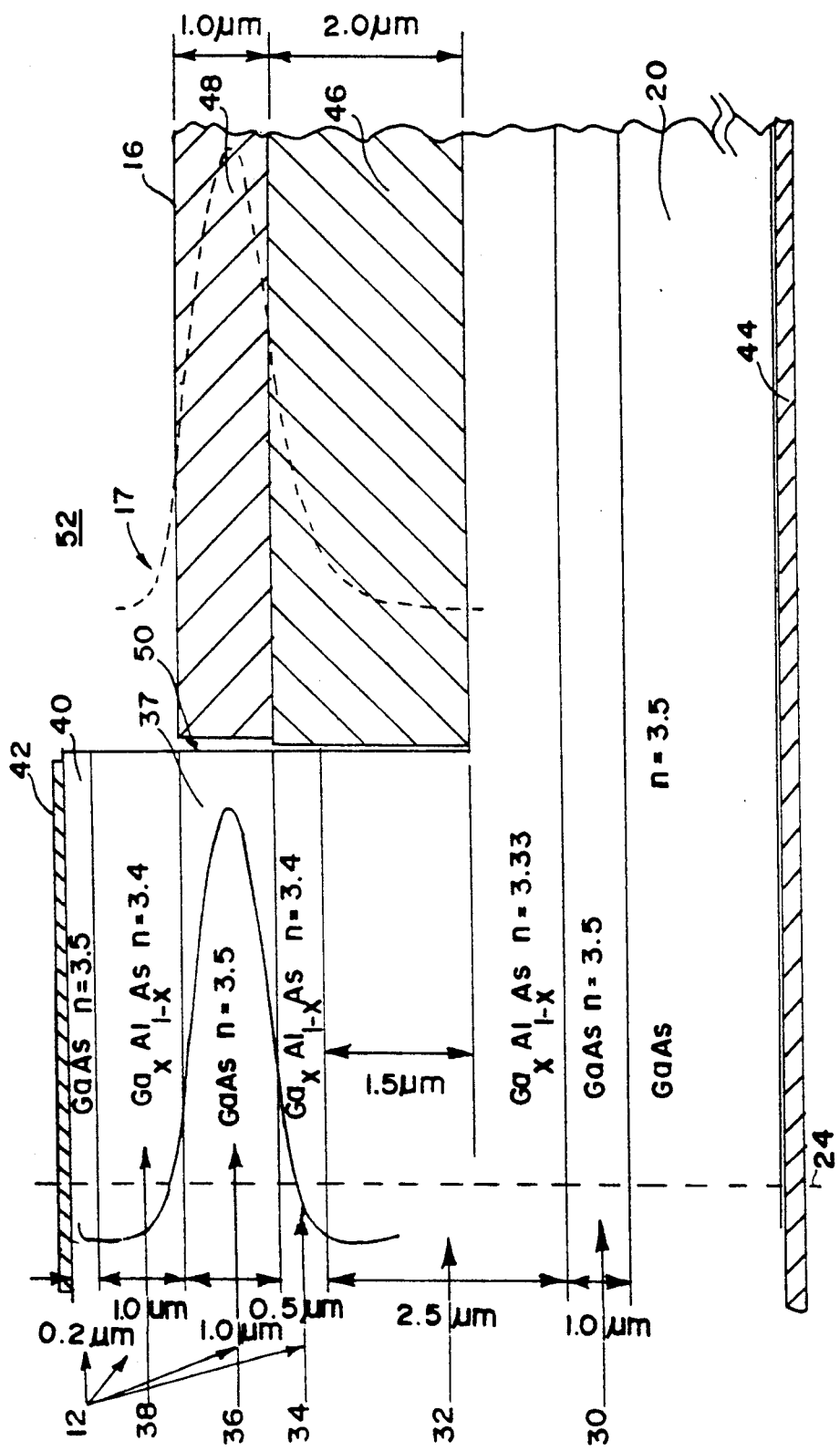

INTEGRATED OPTICAL TAMPER SENSOR WITH PLANAR WAVEGUIDE

The United States Government has rights in this invention pursuant to Contract No. DE-AC04-76DP00789 awarded by the U.S. Department of Energy to American Telephone and Telegraph Company.

BACKGROUND OF THE INVENTION

The present invention relates generally to the field of tamper protection and, more specifically, to the use of optically active, i.e., light emitting and detecting semiconductor and passive dielectric materials monolithically fabricated into a device incorporated into an enclosed sensitive region.

Tamper protection of sensitive equipment has two components: not only to protect against tampering, but also to detect if tampering has occurred. Given the assumption that the protected apparatus is actually in the possession and control of those who would be most likely to tamper with the apparatus, the originator of the device would have an interest in knowing whether tampering with the apparatus or information contained therein actually occurred. This device could be used for immediate sensing resulting in an alarm or penalty, to prevent tampering, but primarily, it is with the second interest of tamper detection that the invention is concerned. Here, the interest is in knowing whether tampering has occurred during some period of time.

There are optical devices which can detect motion and displacement, but these devices are not tamper detectors in the sense described above, because they are not capable of "remembering" that the motion occurred in the past. Thus, there is no means to prevent a tamperer from resetting the device to its original mechanical or electrical condition. Examples of this genera of devices include U.S. Pat. No. 4,560,868, entitled "Fiber Optical Luminescence Sensor for Measuring Mechanical Displacement," to Brogardh et al., U.S. Pat. No. 4,785,180, entitled "Optoelectronic System Housed in a Plastic Sphere," to Dietrich et al., U.S. Pat. No. 4,857,893, entitled "Single Chip Transponder Device," to Carroll, and U.S. Pat. No. 4,967,071, entitled "Fiber Optic Position Sensor," to Park et al.

The devices of Brogradh et al. and Dietrich et al. use individual optical components, such as LEDs, optical fibers, slit diaphragms, and photodetectors, and possibly these components can be substituted or replaced, which cannot be accomplished with an integrated device having all these functions monolithically fabricated onto a single substrate. In addition, rather than using waveguide coupling and absorption of light to detect tampering. Brogradh et al. use luminescence to detect motion and Dietrich et al. detect motion and displacement using the physical motion of a light beam over a photodetector.

The patent to Carroll also identifies an object, and has the same disadvantages as the motion sensors of Brogardh et al. and Dietrich et al. in relation to tamper sensing. The device of Carroll can detect if the identified object is moved out of the range of the transponder. Like Brogradh et al. and Dietrich et al., and Park et al., the Carroll device cannot "remember" that motion has occurred in the past if the object is returned to a location near its original position and there is no mechanism to prevent anyone from resetting the device to hide any evidence of motion in the past. In addition, Carroll uses radio frequency transmission and reception, digital logic, and digital signal processing to achieve the identification function, and the controller/interrogator unit is separate from the transponder. Park et al. use light reflection to detect motion, rather than waveguide coupling and absorption to detect tampering.

The device described in U.S. Pat. No. 4,840,281, entitled "Tamper Evident Optical Device and Article Utilizing the Same," to Phillips et al. does indicate when a package has been tampered with by relying on the selective absorption and reflection of particular colors of light. Moreover, the device by Phillips et al. has a mechanism to prevent the evidence of the tampering from being removed or erased. The light required by Phillips et al., however, is ambient room light, and the photodetector used is the human eye. It is designed for retail consumer packaging, and does not prevent replacement of the apparatus by a sophisticated tamperer.

It is thus an object of the invention to provide an optical tamper sensor to detect if tampering has occurred. This object is attained with the placement of the tamper sensor onto a critical entry plane of an enclosed sensitive region such that elements of the sensor will be irreversibly displaced when tampering occurs. This feature yields the additional advantage of the "pre-tampering" signal being impossible to duplicate.

It is an additional object of the invention to provide an optical tamper sensor which "remembers" that tampering has occurred. The feature of the invention related to this object is the analog or digital memory devices which have the stored signals representing the pretampering condition. An additional advantage is attained by this feature because the pretampering signals can be stored in more than one memory device, one of which can be physically removed from the enclosed sensitive region itself.

It is yet an additional object of the invention to provide a tamper sensor fabricated using integrated semiconductor technology. This object is achieved using optically active semiconductors, and using waveguide coupling and absorption. This feature, in turn, yields the significant advantages of being unobtrusive and easily hidden, as well as durable. An additional advantage is that the device cannot be replaced by another of the same construction because the absorption cannot be duplicated.

These and other objects of the invention are achieved with a tamper sensor having a light-emitting diode and a photodetector connected by a dielectric waveguide, all of which are monolithically fabricated from semiconductor and dielectric materials; the tamper sensor further has at least one absorber randomly placed on the surface of the waveguide, a voltage source to provide voltage to the light-emitting diode and the photodetector, and means for receiving and storing an output signal from the photodetector, wherein the output signal level is representative of a unique optical profile or signature obtained from the placement of the absorber on the surface of the waveguide. It is intended that the tamper sensor be placed onto a critical entry plane of an enclosed sensitive region such that entry into the enclosed sensitive region will displace the absorber from its position on the waveguide and change the optical profile, thus changing the output signal from its original stored value which value can be stored in a physical location removed from the enclosed sensitive region. It is further envisioned that the light-emitting diode is arranged at the center of a hub arrangement with a plurality of waveguides each having one photodetector at its outer end; each waveguide extending radially outward from the light-emitting diode. A plurality of absorbers of varying sizes would be randomly positioned with adhesive to the surface of the waveguides and would result in a unique optical profile or signature of the tamper sensor that would be impossible to duplicate or replicate.

BRIEF DESCRIPTION OF THE DRAWINGS

FIG. 2a is an optical cross-section of a diode and the waveguide in one arm of the tamper sensor.

DESCRIPTION OF THE INVENTION

Figure 1:
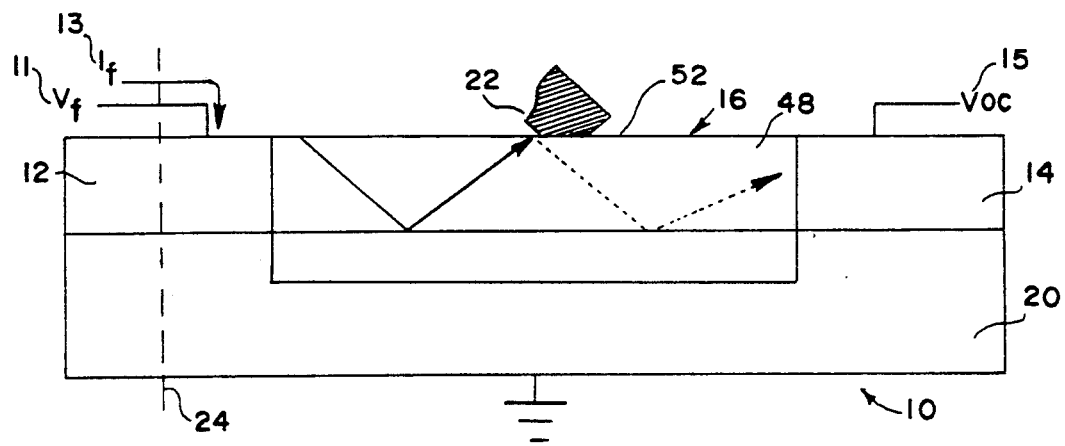
FIG. 1 is an operational schematic of the tamper sensor.

As shown in FIG. 1, the tamper sensor 10 comprises two integrated diodes 12 and 14 separated by a dielectric waveguide 16. The waveguide 16 is comprised of guiding layer 48, a buffer layer 46, and a layer of air or adhesive 52 (shown in FIG. 2). The guiding layer 48 is fabricated on a buffer 46, and the diodes 12, 14, guiding layer 48 and buffer 46 are all fabricated onto a substrate 20. On the upper surface of the waveguide 16 is placed a myriad of absorbers 22, of which only one is shown in FIG. 1.

Figure 3:
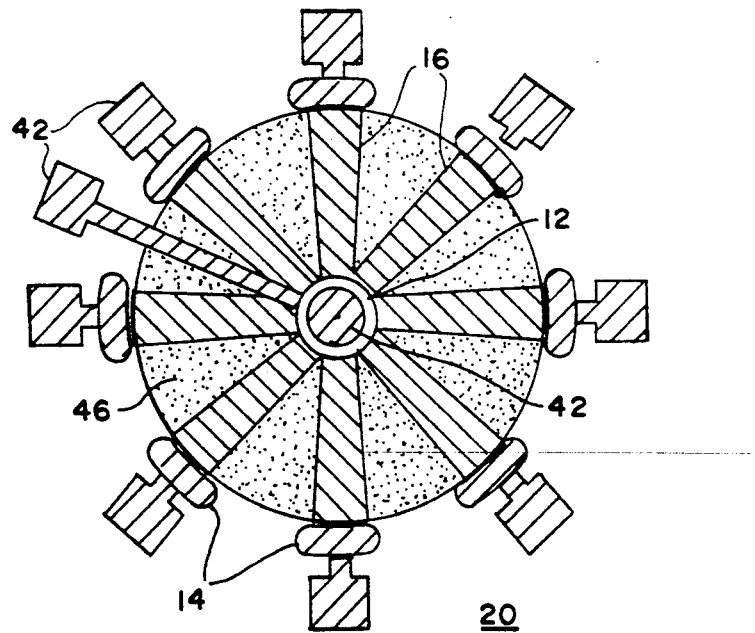
FIG. 3 is a top view of the tamper sensor illustrating the radial arrangement of the light-emitting diode with waveguides and photodetectors extending from the center LED.

In general, when the diode is forward-biased with voltage $V_f$ 11, current $I_f$ 13 flows and it acts as a light-emitting diode 12, and when the diode is reverse biased, it acts as a photodetector 14. With no bias, the photodetector 14 acts as a photovoltaic cell with output $V_{oc}$ 15. Preferably, light-emitting diode 12 is rotated about centerline 24 with several waveguides 16 extending from the LED 12, and photodetectors 14 at the radial ends of waveguides 16. This hub arrangement, as shown in FIG. 3, advantageously uses more of the light emitted from LED 12, which is emitted in all directions. This arrangement is particularly advantageous from the standpoint that is relatively immune to false indications of tamper that could result from variations in temperature and light output from the LED. In this embodiment, only the ratios of the signals from the various detectors 14 are compared to the ratios in the original stored values. Thus absolute changes in the output level of the LED are not detected as false indications of tamper. Alternately, the diodes 14 at the end of the waveguide spokes 16 in the hub arrangement could be forward-biased to function as LEDs, providing an additive signal at the center diode 12, which is then biased to act as a photodetector. This arrangement, while less efficient, would allow the addition of a plurality of low-level signals.

Figure 2B:
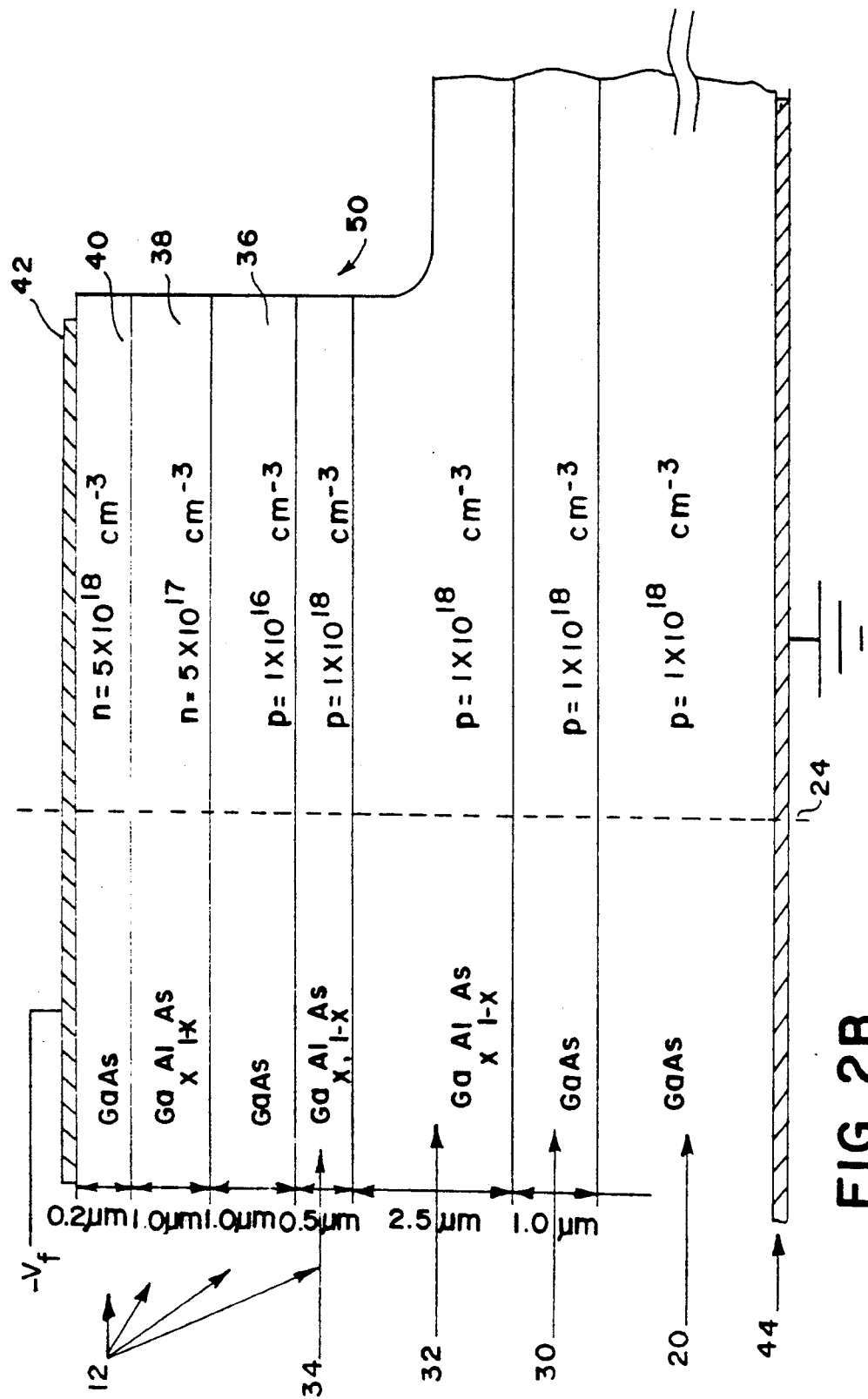
FIG. 2b is an electrical cross section of a diode and the waveguide in one arm of the tamper sensor.

Optical and electrical cross-sectional views of the tamper sensor 10 are shown in FIGS. 2a and 2b. Again, tamper sensor 10 is preferably rotated about centerline 24 to create the hub arrangement shown in FIG. 3. FIGS. 2a and 2b show only one spoke of the hub and only the light-emitting, or light-detecting, diode device with the waveguide portion of the hub arrangement.

The monolithic fabrication of the tamper sensor 10 is revealed in the more detailed layered structure wherein the LED 12 or detector 14 are actually layers of an optically active semiconductor that can both emit and detect light, preferably Type III/V. The layers have varying dopant concentrations to achieve a diode device structure, and the transition and isolating layers surrounding the active optical region have a different composition to produce a lower index of refraction than the active optical region. Such devices and techniques for fabricating monolithic LEDs are well known by those skilled in the art.

Because the diode is oppositely biased for use both as an emitter and detector, it can be built with either a p-type substrate and n-type upper layers as shown, or it can be constructed with a n-type substrate and p-type upper layers. The polarity of the bias on the LED would then be reversed. For either realization, the doping levels of the various layers would be similar to those shown in FIGS. 2a and 2b.

The base of the layered structure of the device is an electrically conductive substrate 20 of high conductivity, preferably of Type III/V, p-type with a dopant concentration of greater than $1 \times 10^{18}$ cm$^{-3}$. On top of substrate 20 is grown another matching base layer 30 of the same semiconductor types, preferably Type III/V, with the same dopant type and a similar concentration as the substrate 20. The controlled growth of the matching base layer 30 corrects and masks defects of substrate 20, usually commercially available, and ensures that subsequent layers are placed upon a planar layer having a matching lattice. Above the matching base layer 30 is a transition layer 32 having a dopant concentration greater than or equal to the substrate and buffer layer dopant concentration, in this case, preferably $Ga_x Al_{1-x}As$ doped p-type at $1 \times 10^{18}$ cm$^{-3}$.

The composition of the transition layer 32 is chosen such that the index of refraction is less than that of the optically active layer 36. Aluminum is the element of choice in this particular ternary system because aluminum lowers the index of refraction to enhance the optical confinement of the transition layer 32. In this embodiment, the concentration of Ga relative to Al is "x"=0.6, and "1−x"=0.4. This yields a refractive index of n=3.33 for the transition layer 32 versus a refractive index of n=3.5 for the GaAs optically active layer 36, substrate 20, and matching base layer 30 at the wavelength of interest, which for GaAs is approximately 860 nm. The chosen composition also causes the transition layer 32 to be transparent at the wavelength of the emitted light. This layer must be thick enough to confine the light in optically active layer 36 and isolate it from the matching base layer 30 and the substrate 20. The required thickness is a function of the wavelength of the light and the difference in refractive index between the transition layer 32 and the optically active layer 36.

Upon the transition layer 32 is grown an additional isolating optical layer 34 of the same elements as transition layer 32, but the proportion of the optically confining element is less to allow a more efficient electrical transition to the optically active layer 36. In this case, $Ga_xAl_{1-x}As$ is used and the proportion of aluminum relative to gallium is less, x=0.7, then the GaAs optically active layer 36. Again, this layer must be highly electrically conductive. Therefore, the doping is chosen as $1 \times 10^{18}$ cm$^{-3}$. This isolating optical layer must also be transparent at the wavelength of interest. It acts together with transition layer 32 to confine light to the optically active layer 36.

Situated above the isolating optical layer 34 is an optically active layer 36 having a refractive index higher than that of the transition layer 32 and the isolating layers 34 and 38. It must be of sufficient thickness to accommodate a single optical waveguide mode, but must not be so thick as to support multiple optical modes. Again, the required thickness is dependent on waveguide properties that are a function of refractive index and wavelength. The optically active layer 36 should have a level of impurity doping that is small enough to allow efficient light emission. In this embodiment, the optically active layer 36 is made from p-type GaAs, having a thickness of 1.0 μm and index of refraction n equal to 3.5 at a wavelength of approximately 860 nm. Its doping concentration is set at $1 \times 10^{16}$ cm$^{-3}$.

On top of the optically active layer 36, is an upper isolating optical layer 38 having n-type dopant. This layer, like transition layer 32 and isolation layer 34, must have a lower refractive index and a larger electrical band-gap than the optically active layer 36, and should be transparent at the wavelength of interest. Its thickness, 1.0 μm in this embodiment, should be large enough to confine the light in optically active region 36 away from the contact layers. This achieved by the use of Ga$_x$Al$_{1-x}$As with $x=0.7$ as in isolating layer 34. Note that isolation layer 38 is doped to form a p-n electrical junction with optically active layer 36. Because of the formation of this junction and the larger band-gap and lower refractive index of upper isolation layer 38, the application of a forward bias V$_f$ 13 will cause a current flow, generating and injecting light into optically active layer 36. Alternately, with no bias or reverse bias, the junction formed will convert light in optically active layer 36 into electrical current or voltage. The required doping concentration in isolation layer 38 is determined by the maximum reverse bias that is needed on the detector. This maximum reverse bias is limited by the avalanche breakdown, which is inversely related to doping concentration. The concentration in this embodiment is $5 \times 10^{17}$ cm$^{-3}$, which gives a typical reverse avalanche voltage of greater than 4 volts. Lower levels would give a larger reverse avalanche voltage.

On top of the upper isolating optical layer 38 is a thin layer 40 that is highly doped and has a smaller electrical band-gap than that of isolating layer 38. This allows convenient electrical contacting to the diode structure. In this embodiment, this contacting layer 40 is approximately 0.2 μm of n-doped Type III/V semiconductor, preferably GaAs. Placed on top of layer 40 is a metal ohmic contact 42. The choice of metal will depend on the composition and doping type of contact layer 40. For an embodiment such as this where the layer is doped n-type, the ohmic contact would be a Germanium-Nickel-Gold alloy. As in FIG. 3, ohmic contact 42 may have a smaller dimension that the mesa-etched LED and thus the thin top layer 40 may extend beyond the dimensions of ohmic contact 42. Alternately, with suitable electrical isolation from the substrate, the contact may be extended beyond the mesa etch structure to form a contact pad 42. Referring back to FIGS. 2a and 2b, an ohmic contact 44 is also situated on the bottom of the substrate 20 to complete the electrical path of the diode 12 or 14.

Alternate embodiments of this diode structure can use semiconductors of other compositions and dopants. These include, but are not limited to other III-V semiconductor binary, ternary, and quaternary compounds that would yield the same basic electrical diode, optical detection, emission, and waveguide properties as the GaAs-Ga$_x$Al$_{1-x}$As structure shown in FIGS. 2a and 2b and described above, though at different optical wavelengths. Such structures might also be constructed in other compound semiconductor materials such as those from column IVB and VIB, of the periodic table, such as lead tin telluride, having a high refractive index, and lead telluride with a lower refractive index.

Also as shown in FIGS. 2a and 2b, material is etched away from the transition layer 32. Into this region is deposited the waveguide 16. Waveguide 16 is a mesa comprising a buffer layer 46 and a dielectric guiding layer 48. Buffer layer 46 is approximately 2.0 μm in depth and is deposited into the transition layer 32. The depth of the etch and corresponding thickness of buffer layer 46 is a function of the thickness of the dielectric guiding layer 48, the refractive index difference between dielectric guiding layer 48 and buffer 46, and the position of dielectric waveguide layer 48 relative to the optically active layer 36. These two layers must allow the field profile 37 in the optical mode of the optically active layer 36 to closely match the field profile 17 of waveguide 16, so that light can couple between the diode (12 or 14) and the waveguide 16. This is the "coupling criteria" that guides the design of the waveguide relative to that of the active diode. Preferably, the buffer layer 46 has a low absorption at the wavelength of interest: deposition of the buffer 46 must be compatible with semiconductor processing; the buffer layer 46 must be an electrical insulator, and it must not have surface deviations which will scatter light. These criteria have been met with the use of plasma-deposited SiO$_2$ as the buffer material. Other buffer materials might include spin-on glasses or polymer materials. Thickness for other buffers would be determined by the optical mode matching criteria described above, as calculated for the refractive index of the alternative buffer.

On top of buffer layer 46, is the dielectric guiding layer 48. The depth, dimensions, and optical characteristics of dielectric waveguide 16 must coincide with those of layers 32, 34, 36 and 38 in the diode 12 or 14 so that the mode matching conditions above will be satisfied, and the light will efficiently pass into the waveguide from edge 50. The intrinsic features of the material of the dielectric guiding layer 48 are that it must be transparent, it must have an appropriate index of refraction with respect to the buffer layer 46 to maintain the optical field profile of the diodes 12 and 14, it must be an electrical insulator, it must be compatible with the semiconductor processing techniques, and it must not have a rough surface that will scatter light. Typical materials may be polyimides or other organic polymers, and inorganic films such as silicon oxynitrides, alumina, and doped silicon dioxides. Above the dielectric guiding layer 48 is a layer of air or adhesive 52 that forms the cover layer for waveguide 16.

Referring now to FIG. 1, an absorber 22 is situated upon waveguide 16. Absorber 22 preferably has a higher index of refraction than the dielectric waveguide material in layer 48, it should be absorptive at the wavelength of interest, it should be capable of varying and random dimensions, but smaller than the width of the waveguide 16, so that any one absorber will not attenuate the light too much. In the preferred present embodiment, pulverized silicon is used for the absorber material. While absorber 22 should adhere to the surface of the guiding layer 48, it should not deform the waveguide. Absorber 22 may be suspended in an adhesive having similar optical and electrical characteristics as buffer layer 46, so that absorber 22 is fixed upon the guiding layer 48 and attached to the critical entry plane in the protected sensitive region. In this case, the adhesive replaces air layer 52 on guiding layer 48. Thickness values for guiding layer 48 are adjusted according to the new calculations, based on the index of refraction of layer 52, in order to satisfy the mode matching criteria.

Figure 4:
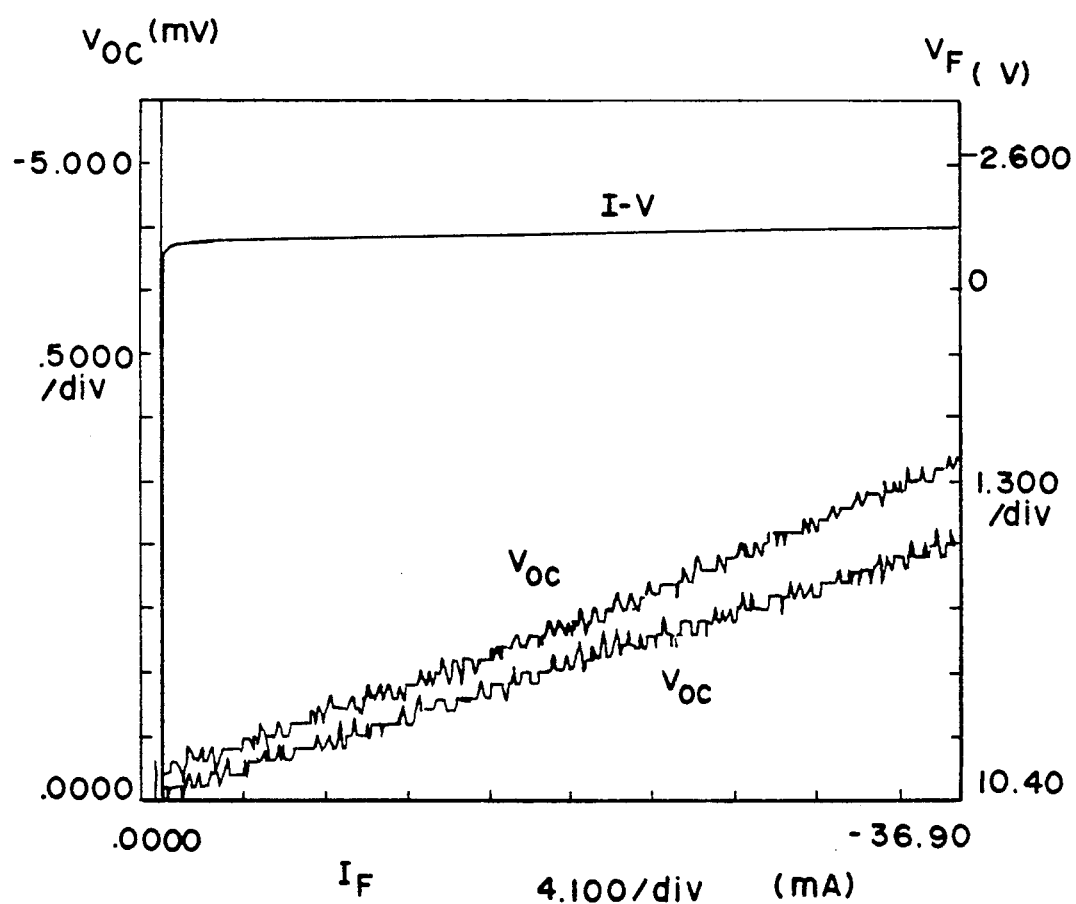
FIG. 4 is a voltage output of the tamper sensor with and without absorbers placed on the surface of the waveguide.

The ohmic contacts 42 and 44 are connected to electrical power sources and to output circuitry within an enclosed sensitive region. FIG. 4 illustrates the transfer function of the LED-waveguide-detector which is the output $V_{oc}$ of the detector plotted against the LED input $I_F$ with and without external absorbers. Light generated by LED 12 travels through the dielectric guiding layer 48 and is received on the other end of the waveguide 16 by the photodiode 14, which for no bias, produces a voltage $V_{oc}$ in proportion to the amount of light received. If an absorber 22 is positioned on the waveguide 16, some light will be absorbed and the voltage output from the photodiode 14 will decrease. The voltage output from the photodiode 14 is converted to a digital signal by an analog-to-digital converter (not shown), and the digital signal can be stored in digital storage elements (not shown) within the enclosed sensitive region. This circuitry records the electrical signal from a single photodetector 14, shown in FIG. 1. Preferably, however, the ratios of signals in the various photodetectors 14 in FIG. 3 are recorded. The recorded signals then comprise a reference that is compared periodically with the newly measured ratio of signals to determine whether tampering has occurred. Alternately, the reference signal could be stored by analog means (not shown), but the present preferred embodiment would use conversion to digital storage.

The invention involves the use of absorbers 22 of random sizes placed at random positions upon the surfaces of the waveguide 16 in a radial arrangement as in FIG. 3. The use of absorbers in this arrangement creates a unique, but arbitrary, optical and electrical profile, or signature, stored in digital or analog storage elements. This profile can be recorded prior to giving the protected apparatus to another party. This optical/electrical profile cannot be duplicated if the positions of the absorbers 22 upon the waveguide 16 are changed.

The tamper sensor 10 is placed in the entry plane of an enclosed sensitive region. If the enclosed sensitive region is penetrated, absorbers 22 will be irreparably displaced. Any attempt to duplicate the original positioning will be electronically recorded either in real time or it can be recorded and read later.

While the present invention has been described with respect to an exemplary embodiment thereof, it will be understood by those of ordinary skill in the art that variations and modifications can be effected within the scope and spirit of the invention.

What is claimed is:

1. A tamper sensor comprising:
   (a) a light-emitting diode;
   (b) a dielectric waveguide adjacent on one end to said light-emitting diode through which light travels;
   (c) a photodetector adjacent to said waveguide on an opposite end to receive light traveling through said waveguide;
   (d) at least one absorber randomly placed on the surface of said waveguide;
   (e) a voltage source to provide voltage to said light-emitting diode; and
   (f) means for receiving an output signal from said photodector, said output signal representative of an optical profile obtained from the placement of said absorber on said waveguide;
   wherein said light-emitting diode, said dielectric waveguide and said photodetector are integrated using semiconductor materials, and wherein said tamper sensor is placed into a critical entry plane of an enclosed sensitive region such that entry into said enclosed sensitive region will displace said absorber from said position and change said optical profile.

2. The tamper sensor of claim 1, wherein said light-emitting diode is arranged at the center of a hub arrangement and a plurality of said waveguides extend radially outward from said light-emitting diode, and a plurality of said photodetectors, one of said photodetectors positioned at the outer end of said waveguide, with a plurality of said absorbers randomly positioned on said waveguides, resulting in a unique optical profile.

3. The tamper sensor of claim 2, wherein said means for receiving an output signal from said photodetector further comprises an analog to digital converter and means for storing said digital signal, said digital signal representative of an optical signature resulting from the random placement of absorbers onto said waveguide.

4. The tamper sensor of claim 2, wherein said means for receiving an output signal from said photodetector further comprises an analog storage.

5. The tamper sensor of claim 3, wherein said absorbers are adhesively attached to the surface of said dielectric waveguides such that when said critical entry plane is disrupted, said absorbers are irreversibly displaced from said surfaces.

6. The tamper sensor of claim 5, wherein said light-emitting diode and said photodetectors are made from integrated Type III/V semiconductor materials.

7. The tamper sensor of claim 5, wherein said light-emitting diode and said photodetectors are made from integrated Type IV/VI semiconductor materials.

8. The tamper sensor of claim 6, wherein said Type III/V semiconductor materials include GaAs as an optically active region, and $Ga_xAl_{1-x}As$ as an isolating optical layer.

9. The tamper sensor of claim 5, wherein said dielectric waveguide is from a group that includes polyimide, silicon oxynitride, organic polymers, inorganic films, alumina, and doped silicon dioxide.

10. The tamper sensor of claim 5, wherein said absorber is made from pulverized silicon.

11. A tamper sensor comprising:
    (a) a light-emitting diode separated from a photodetector by a dielectric waveguide, said light-emitting diode and said photodetector and said dielectric waveguide monolithically fabricated, said light-emitting diode and said photodetector have a layer of GaAs as an optically active region, and $Ga_xAl_{1-x}As$ as an isolating optical layers situated above and below said optically active region, said light-emitting diode arranged at the center of a hub arrangement and a plurality of said waveguides extend radially outward from said light-emitting diode, and a plurality of said photodetectors, one of said photodetectors positioned at the outer end of said waveguide;

(b) a plurality of absorbers of varying dimensions randomly and adhesively positioned on said waveguides;
(c) a power source; and
(d) means for receiving and storing an output signal from said photodetector, said output signal representative of an optical profile obtained from the placement of said absorber on said waveguide;

wherein said tamper sensor is placed into a critical entry plane of an enclosed sensitive region such that entry into said enclosed sensitive region will irreversibly displace said absorbers from their positions on said waveguide, and said displacement will cause a change said optical profile.

12. A tamper sensor comprising:
(a) a critical entry plane;
(b) means to generate and to receive at least one optical waveform in an integrated active optical element;
(c) means to couple said optical waveform;
(d) means to randomly alter the optical characteristics of said optical waveform, said randomly alterning means in contact with said means to couple said optical waveform; and
(e) means to record the optical characteristics of said optical waveform before tampering, and after tampering, to compare said optical characteristics altered, by entry into said critical entry plane which disrupts said means to randomly alter the optical characteristics of said optical waveform;

whereby tampering within a critical entry plane is detected where recorded results of said before tampering and after tampering conditions are not the same.

* * * * *